(12) United States Patent
Ichitsubo et al.

(10) Patent No.: US 7,477,108 B2
(45) Date of Patent: Jan. 13, 2009

(54) THERMALLY DISTRIBUTED INTEGRATED POWER AMPLIFIER MODULE

(75) Inventors: Ikuroh Ichitsubo, Kanagawa Prefecture (JP); Masaya Kuwano, Kanagawa Prefecture (JP); Koshiro Matsumoto, Tokyo (JP)

(73) Assignee: Micro Mobio, Inc., Palo Alto, CA (US)

( * ) Notice: Subject to any disclaimer, the term of this patent is extended or adjusted under 35 U.S.C. 154(b) by 109 days.

(21) Appl. No.: 11/486,465

(22) Filed: Jul. 14, 2006

(65) Prior Publication Data

US 2008/0012645 A1 Jan. 17, 2008

(51) Int. Cl.
H03F 3/14 (2006.01)
(52) U.S. Cl. .......................... 330/307; 330/66; 330/286; 330/295
(58) Field of Classification Search .................. 330/66, 330/286, 295, 307
See application file for complete search history.

(56) References Cited

U.S. PATENT DOCUMENTS

| | | | |
|---|---|---|---|
| 4,456,888 A * | 6/1984 | Ayasli .......................... 330/277 |
| 4,977,041 A | 12/1990 | Shiozawa et al. |
| 5,050,238 A | 9/1991 | Tomizuka et al. |
| 5,061,944 A | 10/1991 | Powers et al. |
| 5,164,683 A | 11/1992 | Shields |
| 5,255,324 A | 10/1993 | Brewer et al. |
| 5,283,539 A | 2/1994 | Sadhir |
| 5,548,239 A | 8/1996 | Kohama |
| 5,608,364 A | 3/1997 | Hirai |
| 5,625,894 A | 4/1997 | Jou |
| 5,656,972 A | 8/1997 | Norimatsu |
| 5,697,087 A | 12/1997 | Miya |
| 5,732,334 A | 3/1998 | Miyake |
| 5,825,227 A | 10/1998 | Kohama et al. |
| 5,880,635 A | 3/1999 | Satoh |
| 5,969,560 A | 10/1999 | Kohama et al. |
| 6,025,651 A | 2/2000 | Nam |
| 6,046,703 A | 4/2000 | Wang et al. |
| 6,075,995 A | 6/2000 | Jensen |
| 6,118,985 A | 9/2000 | Kawakyu et al. |
| 6,121,842 A * | 9/2000 | Adlerstein et al. .......... 330/307 |
| 6,148,220 A | 11/2000 | Sharp et al. |
| 6,151,509 A | 11/2000 | Chorey |
| 6,175,279 B1 | 1/2001 | Ciccarelli |
| 6,183,703 B1 | 2/2001 | Hsu et al. |
| 6,198,351 B1 | 3/2001 | Winslow |
| 6,203,587 B1 | 3/2001 | Lesieur et al. |
| 6,232,840 B1 * | 5/2001 | Teeter et al. ................. 330/295 |
| 6,262,630 B1 | 7/2001 | Eriksson |
| 6,265,943 B1 | 7/2001 | Dening et al. |
| 6,265,954 B1 | 7/2001 | Krause |

(Continued)

OTHER PUBLICATIONS

U.S. Appl. No. 10/385,059.

(Continued)

*Primary Examiner*—Khanh V Nguyen
(74) *Attorney, Agent, or Firm*—Tran & Associates

(57) ABSTRACT

An integrated power amplifier (PA) module formed on a substrate includes a first cluster of transistor cells positioned in a first portion of the substrate; a second cluster of transistor cells positioned in a second portion of the substrate and spaced apart from the first portion; and a combiner coupled to the first and second clusters to combine the output of the first and second clusters.

20 Claims, 9 Drawing Sheets

Multiple Clusters of Transistor Cells

U.S. PATENT DOCUMENTS

| | | |
|---|---|---|
| 6,281,755 B1 | 8/2001 | Feld et al. |
| 6,281,762 B1 | 8/2001 | Nakao et al. |
| 6,294,967 B1 | 9/2001 | Hirai |
| 6,326,866 B1 | 12/2001 | Sasaki |
| 6,333,682 B1 | 12/2001 | Seely et al. |
| 6,337,606 B1 | 1/2002 | Brombaugh et al. |
| 6,359,508 B1 | 3/2002 | Mucenieks |
| 6,359,515 B1 | 3/2002 | Buer |
| 6,362,685 B1 | 3/2002 | Vagher |
| 6,362,689 B1 | 3/2002 | Buer |
| 6,362,701 B1 | 3/2002 | Brombaugh et al. |
| 6,366,788 B1 | 4/2002 | Fujioka et al. |
| 6,384,680 B1 | 5/2002 | Takei et al. |
| 6,388,528 B1 | 5/2002 | Buer et al. |
| 6,396,349 B2 | 5/2002 | Takei et al. |
| 6,397,039 B1 | 5/2002 | Butte et al. |
| 6,404,784 B2 | 6/2002 | Komine |
| 6,404,823 B1 | 6/2002 | Grange et al. |
| 6,417,730 B1 | 7/2002 | Segallis et al. |
| 6,420,929 B1 | 7/2002 | Ha |
| 6,421,361 B1 | 7/2002 | Neuberger et al. |
| 6,424,216 B2 | 7/2002 | Mu et al. |
| 6,462,622 B1 | 10/2002 | Mori et al. |
| 6,483,398 B2 | 11/2002 | Nagamori et al. |
| 6,496,684 B2 | 12/2002 | Nakao et al. |
| 6,625,050 B2 | 9/2003 | Suwa et al. |
| 6,630,372 B2 | 10/2003 | Ball |
| 6,639,466 B2 | 10/2003 | Johnson |
| 6,677,833 B2 | 1/2004 | Sheen |
| 6,678,506 B1 | 1/2004 | Dolman |
| 6,678,508 B1 | 1/2004 | Koilpillai et al. |
| 6,683,512 B2 | 1/2004 | Nakamata |
| 6,693,498 B1 | 2/2004 | Sasabata et al. |
| 6,694,129 B2 | 2/2004 | Peterzell et al. |
| 6,696,903 B1 | 2/2004 | Kawahara |
| 6,707,341 B2 | 3/2004 | Yamamoto et al. |
| 6,720,850 B2 | 4/2004 | Sasabata et al. |
| 6,762,659 B2 | 7/2004 | Son |
| 6,774,718 B2 | 8/2004 | Ichitsubo et al. |
| 6,798,287 B2 | 9/2004 | Wu et al. |
| 6,822,515 B2 | 11/2004 | Ichitsubo et al. |
| 6,847,262 B2 | 1/2005 | Ichitsubo et al. |
| 6,911,942 B2 | 6/2005 | Fukuda |
| 6,914,482 B2 | 7/2005 | Ichitsubo et al. |
| 7,071,783 B2 | 7/2006 | Ichitsubo et al. |
| 2004/0203552 A1 | 10/2004 | Horiuchi et al. |
| 2004/0204037 A1 | 10/2004 | He et al. |
| 2005/0179498 A1 | 8/2005 | Tsutsui et al. |
| 2005/0239415 A1 | 10/2005 | Sagae et al. |
| 2006/0164188 A1 | 7/2006 | Yamada |

OTHER PUBLICATIONS

U.S. Appl. No. 10/804,737.
U.S. Appl. No. 10/843,409.
U.S. Appl. No. 10/919,850.
U.S. Appl. No. 10/938,779.
U.S. Appl. No. 10/972,636.
U.S. Appl. No. 11/039,687.
U.S. Appl. No. 11/064,281.
U.S. Appl. No. 11/110,249.
U.S. Appl. No. 11/121,288.
U.S. Appl. No. 11/126,667.
U.S. Appl. No. 11/152,308.
U.S. Appl. No. 11/173,739.
U.S. Appl. No. 11/173,741.
U.S. Appl. No. 11/173,965.
U.S. Appl. No. 11/173,968.
U.S. Appl. No. 11/323,763.
U.S. Appl. No. 11/323,788.
U.S. Appl. No. 11/433,896.
U.S. Appl. No. 11/486,465.
U.S. Appl. No. 60/698,586.
U.S. Appl. No. 10/385,059, filed Feb. 7, 2005, Ikuroh Ichitsubo.
U.S. Appl. No. 10/804,737, filed Mar. 18, 2004, Ikuroh Ichitsubo.
U.S. Appl. No. 10/843,409, filed May 10, 2004, Ikuroh Ichitsubo.
U.S. Appl. No. 10/919,850, filed Aug. 16, 2004, Shinsuke Inui.
U.S. Appl. No. 10/938,779, filed Sep. 10, 2004, Ikuroh Ichitsuho.
U.S. Appl. No. 10/972,636, filed Oct. 24, 2004, Kanya Kubota.
U.S. Appl. No. 11/039,687, filed Jan. 19, 2005, Ikuroh Ichitsubo.
U.S. Appl. No. 11/064,261, filed Feb. 24, 2005, Ikuroh Ichitsubo.
U.S. Appl. No. 11/110,249, filed Apr. 20, 2005, Ikuroh Ichitsubo.
U.S. Appl. No. 11/121,288, filed May 2, 2005, Ikuroh Ichitsubo.
U.S. Appl. No. 11/126,667, filed May 11, 2005, Ikuroh Ichitsubo.
U.S. Appl. No. 11/152,308, filed Jun. 14, 2005, Ikuroh Ichitsubo.
U.S. Appl. No. 11/173,741, filed Jul. 2, 2005, Ikuroh Ichitsubo.
U.S. Appl. No. 11/173,965, filed Jul. 2, 2005, Ikuroh Ichitsubo.
U.S. Appl. No. 11/173,968, filed Jul. 2, 2005, Ikuroh Ichitsubo.
U.S. Appl. No. 11/323,763, filed Dec. 30, 2005, Ikuroh Ichitsubo.
U.S. Appl. No. 11/323,788, filed Dec. 30, 2005, Ikuroh Ichitsubo.
U.S. Appl. No. 11/433,896, filed May 12, 2006, Ikuroh Ichitsubo.
U.S. Appl. No. 11/486,465, filed Jul. 14, 2006, Ikuroh Ichitsubo.
U.S. Appl. No. 60/698,586, filed Dec. 7, 2005, Wang.

* cited by examiner

Multiple Clusters of
Transistor Cells

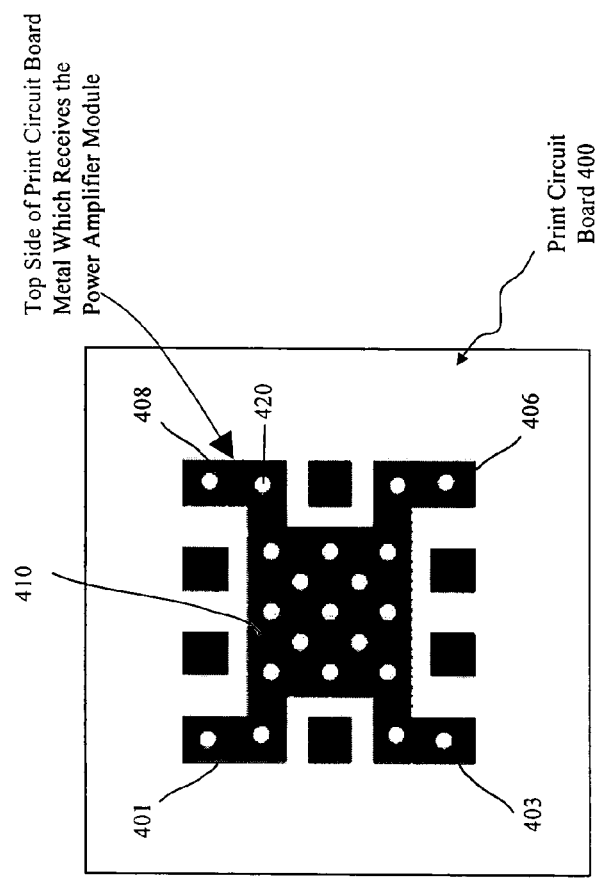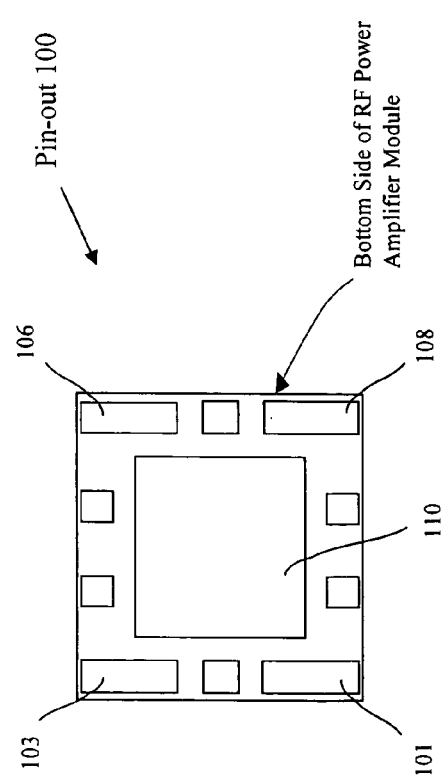
Fig 3

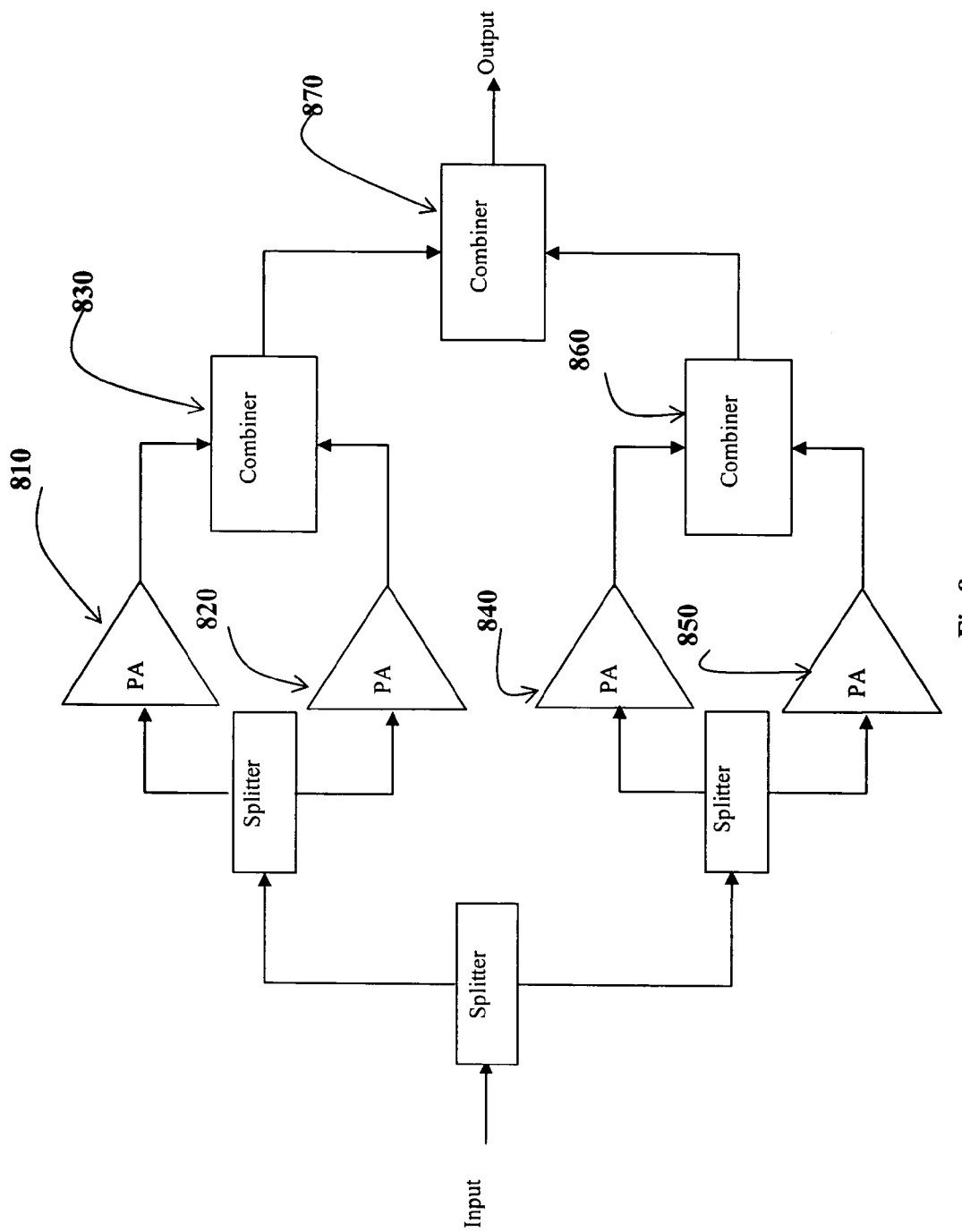

THERMALLY DISTRIBUTED INTEGRATED POWER AMPLIFIER MODULE

BACKGROUND

The present invention relates to radio frequency (RF) power amplifiers (PA) module.

Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of the wireless communication device is the radio frequency PA. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled, on a printed circuit board (PCB) in which the components are interconnected by layers printed metal circuits and layers of dielectric substrates.

One significant issue for high power devices such as PAs is thermal dissipation. Power amplifiers for mobile communications currently, widely used include monolithic microwave integrated circuits (MMICs), hybrid integrated circuits (hybrid ICs), multichip modules and the like. These modules have an amplifying element in the form of a GaAs-metal semiconductor field effect transistor (GaAs-MESFET), a high electron mobility transistor (HEMT), a hetero-junction bipolar transistor (HBT) or the like.

A power amplifier employs a transistor device generally configured of a plurality of transistor cells arranged on a semiconductor substrate in rows and columns. Hereinafter such a configuration will also be referred to as a multi transistor cell configuration. The operating performance of such multi transistors can be affected by temperature, particularly when high power transmission is desired.

As described in U.S. Pat. No. 6,707,341, if a specific transistor cell receives an intensive current attributed to thermal unevenness the entire transistor device might have an impaired amplification characteristic. Furthermore, if such an intensive current is further intensified, not only is an amplification characteristic impaired but the transistor device may be destroyed. Such disadvantages attributable to intensive current are common among bipolar transistor devices having multi transistor configuration. A GaAs substrate, on which an HBT is formed, has a high thermal resistance and once heat is generated it is typically remains in the substrate and results in a thermally uneven profile across transistor cells.

Ballast resistors have been used to prevent a bipolar transistor device having a multi transistor cell configuration from having an uneven collector current attributable for example to an uneven temperature distribution caused by temperature generation. Each base ballast resistor and each emitter ballast resistor when their respective transistor cell operates give a negative feedback to a base current and an emitter current, respectively. Thus they act to eliminate a variation in current between transistor cells to provide a uniform current. This can prevent a specific transistor cell from intensively receiving current and thus prevent the transistor from being thermally destroyed.

The U.S. Pat. No. 6,707,341 patent notes that transistor cells arranged in rows and columns can have a more uniform thermal distribution there across if a smaller number of transistor cells are arranged closer to the center of the transistor device and a larger number of transistor cells are arranged closer to the periphery thereof to alleviate heat generation and thermal effect at the center thereof or if ballast resistors closer to the center thereof, which generates heat intensively, are adapted to have a large value of resistance and those closer to the periphery thereof, which is free from significant temperature elevation, are adapted to have a small value of resistance. However, as further mentioned in the U.S. Pat. No. 6,707,341 patent, such adjustments, however, require a long period of time to optimize the number of transistor cells and the values in resistance of ballast resistors and they would in effect be hard to achieve.

SUMMARY

In one aspect, an integrated power amplifier (PA) module formed on a substrate includes a first cluster of transistor cells positioned in a first portion of the substrate; a second cluster of transistor cells positioned in a second portion of the substrate and spaced apart from the first portion; and a combiner coupled to the first and second clusters to combine the output of the first and second clusters.

In another aspect, a wireless module formed on a substrate includes a first power amplifier positioned above a first thermally distributed portion of the substrate; a second power amplifier positioned above a second thermally distributed portion of the substrate spaced apart from the first thermally distributed portion; and a combiner coupled to the first and second power amplifiers to combine the output of the first and second power amplifiers.

Implementations of the above aspects may include one or more of the following. The module can have a third cluster of transistor cells positioned in a third portion of the substrate spaced apart from the first and second clusters; a fourth cluster of transistor cells positioned in a fourth portion of the substrate spaced apart from the first, second and third clusters; a second combiner coupled to the third and fourth clusters; and a third combiner coupled to the first and second combiners to combine the output of the first, second, third and fourth clusters. Each combiner is thermally separated from each other. Each cluster can include one or more of: impedance matching, biasing circuit, control circuit, driver, or power sensing circuit. A molding compound can be formed between the first and second thermal conductor portions. The combiner is positioned above a third portion of the substrate. A current-sensing circuit is provided to sense current that is directly proportional to the PA's supply current. The thermally distributed integrated PA module has multiple semiconductor transistors with power splitters at the input ports of PA's and power combiners at the output ports of PAs. The substrate dimensions can be approximately 10 mm×10 mm and a thickness of about 1.5 mm. Each ground pad can be a rectangular pad with dimensions of about 0.9 mm×2.7 mm. The input and output pads can be square pads with dimensions of about 0.9 mm×0.9 mm and separated from adjacent ground pads with center-to-center separations of about 2.2 mm. A ground plane is provided with dimensions of about 7.1 mm×7.1 mm positioned spaced apart from the ground pads and the input and the output pads by about 0.45 mm. The ground plane can be about 0.95 mm from the fourth side. The second side can have five square pads each about 0.9 mm×0.9 mm in dimensions and each separated from each other by about 1.75 mm when measured from center to center. The center of a pad corresponding to pin 4 can be about 2.35 mm from the first side. The substrate can have dimensions of approximately 10 mm×10 mm and a thickness of about 1.5 mm, each ground pad comprises a rectangular pad with dimensions of about 0.9 mm×2.7 mm, the input and output pads comprise square pads with dimensions of about 0.9 mm×0.9 mm and separated from adjacent ground pads with center-to-center separations of about 2.2 mm, further comprising a ground plane with dimensions of about 7.1 mm×7.1 mm positioned spaced apart from the ground pads and the input and the output pads by about 0.45 mm and wherein the ground plane is about 0.95 mm from the fourth side, and wherein the second side comprises five square pads each about 0.9 mm×0.9 mm in dimensions and each separated from each other by about 1.75 mm when measured from center to center the center of a pad corresponding to pin 4 is about 2.35 mm from the first side. The substrate can have dimensions of approximately 4 mm×4 mm and a thickness of about 1 mm. Each ground pad can be a rectangular pad with dimensions of about 0.40 mm×0.23 mm. The input and output pads can be square pads with dimensions of about 0.4 mm×0.4 mm and separated from adjacent ground pads with center-to-center separations of about 0.65 mm. A ground plane can be provided with dimensions of about 2.7 mm×2.7 mm and wherein the ground plane is about 0.25 mm from the fourth side. Each pads can be about 0.40 mm×0.23 mm in dimensions and each separated from each other by about 0.65 mm when measured from center to center. The substrate can have dimensions of approximately 4 mm×4 mm and a thickness of about 1 mm, each ground pad comprises a rectangular pad with dimensions of about 0.40 mm×0.23 mm, the input and output pads comprise square pads with dimensions of about 0.40 mm×0.23 mm and separated from adjacent ground pads with center-to-center separations of about 0.65 mm. The quality of the amplified radio frequency signal includes one or more of inter-modulation components of the amplified radio frequency signal. The quality of the amplified radio frequency signal includes Error Vector Magnitude (EVM), Bit Error Rate (BER), Packet Error Rate (PER), Adjacent Channel Power Ratio (ACPR) or other standards. The magnitude of the amplified radio frequency signal includes one or more of the gain, the voltage, the current, and the power of the amplified radio frequency signal. The radio frequency power amplifier outputs the amplified radio frequency signal under the control of a bias signal. The bias signal is controlled by the power-sensing control signal.

In another aspect, the present invention provides a power amplifier module for amplifying radio frequency signals, comprising: a) radio frequency power amplifier with multiple semiconductor transistors adapted to receive an input RF signal and a processed power-sensing control signal and to output an amplified RF signal; b) a power-sensing circuit adapted to receive the amplified radio frequency signal and to output the power-sensing control signal; c) a current-sensing circuit adapted to senses current that is directly proportional to the PA supply current.

In one implementation, the module includes a control logic that receives and processes the power-sensing control signal, and outputs a processed power-sensing control signal in response to a quality or a magnitude of the amplified radio frequency signal.

The PA module disclosed in this invention is a linear amplifier, which provides good linearity and low harmonics over a wide frequency range covering from several megahertz (MHZ) to tens of gigahertz (GHZ) by the feedback control based on the qualities and power level of the amplified radio frequency signal. Specifically, high order inter-modulation distortions are suppressed. The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, IEEE 802.11 WLAN, 802.16 WiMax, WiBro and others. The PA module in accordance to the present invention especially provides reliable amplification to the Wireless Local Area Network (WLAN) applications.

In another aspect, a number of electronic components and circuits are integrated within the RF amplifier module, including impedance matching circuits for input and output RF signals. The RF amplifier module is compact and has smaller foot print compared to prior art implementations. The integrated RF amplifier module can be conveniently designed and assembled in a RF transmission device.

Another feature of the PA module in the present invention is that the output signal from the power sensing circuit can be used to optimally control the bias current and operation characteristics of the power amplifiers. As a result, the PA module provides highly linear output power at reduced current consumption.

Yet another feature of the invention is that the RF amplifier design enables manufacturing consistency since the input and output matching circuits are included in the module. Common problems related to the manufacturing tolerance of the matching circuit components are therefore eliminated. The RF amplifier design is adapted to high frequency circuitry by utilizing semiconductor materials such as Gallium Arsenide Heterojunction Bipolar Transistors (GaAs HBT).

The current-sensing feature of the PA module in the present invention is adapted to senses current that is directly proportional to the supply current. In particular, high-speed current sensing is a common problem faced by designer with some significant challenges, which can increase the junction temperature rapidly; current-sensing feature eliminates the problems.

A feature of the present invention is the efficient grounding, shielding and thermal conduction provided in the RF amplifier module. The power amplifier circuit is fabricated on a semiconductor chip having an electrically conductive base. The RF power amplifier module includes a multi-layer three-dimensional substrate having a bottom metal layer adapted to bond with the printed circuit board (PCB) of a wireless communication device. The substrate has one or more upper layers adapted to receive the amplifier chip and other off-chip components. The bottom layer includes grounding metal Pins that are located at the center and at each corner, which is registered and adapted to bond with the circuit pattern on PCB of the wireless communication device. The metal Pins are connected to the upper layers through the multilayer three-dimensional substrate by a plurality of metal via holes.

A wireless integrated module formed on a substrate includes a first power amplifier positioned above a first thermal conductor portion of the substrate; a second power amplifier positioned above a second thermal conductor portion of the substrate spaced apart from the first thermal conductor portion; and a combiner coupled to the first and second power amplifiers to combine the output of the first and second power amplifiers.

Implementations of the integrated module may include one or more of the following. The first and second thermal conductor portions can be thermally separated. A molding compound can be formed between the first and second thermal conductor portions. The combiner can be positioned above a third thermal conductor portion of the substrate. Third and fourth power amplifiers can be positioned above third and fourth thermal conductor portions of the substrate. A second combiner can be connected to the third and fourth thermal conductor portions of the substrate, and a third combiner can then be connected to the first and second combiner outputs. Each combiner can be thermally separated from each other. The substrate can be a semi-insulating compound semiconductor substrate, a micro-strip on printed circuit board, a copper-clad epoxy fiberglass, a Low Temperature Co-fired Ceramic (LTCC) substrate, a gallium arsenide substrate, or a silicon substrate. The substrate can have first, second and third sides with pads positioned thereon and a fourth side without a pad, the substrate having an input pad on a first side coupled to an input RF signal and positioned between two ground pads, the substrate further having an output pad on a third side coupled to an amplified output RF signal and positioned between two other ground pads.

In another aspect, a method for providing wireless power amplification includes positioning a first power amplifier above a first thermal conductor portion of the substrate; positioning a second power amplifier positioned above a second thermal conductor portion of the substrate spaced apart from the first thermal conductor portion; and combining the outputs of the first and second power amplifiers.

Advantages of the integrated module may include one or more of the following. Heat dissipation is distributed in four quadrants of the module, enabling the module to operate with an average temperature that is evenly at a lower temperature than the prior art which positions the power transistors in one concentrated region of the module. The resulting integrated module is cool and has improved performance characteristics including linearity as the thermally distributed power transistors operate at a low temperature. The resulting module can handle high power and can transmit/receive over an increased range.

Other advantages include the ability to properly control the quality and power level of the amplified RF signals to be transmitted. In particular for high data rate wireless communications, the amplification of RF signals is required to be linear over a wide signal power range and over a given frequency range. Preferably the amplification is reduced or increased according to input RF signal, transmittance range and data rate so that power consumption can be optimized.

The system also provides proper grounding and RF signal isolation. A power amplifier typically has high current flowing through the circuit. A non-zero impedance in the circuit can easily induce a voltage, potentially injecting unwanted noise into the RF system. The circuit board provides proper grounding to avoid unintended feedback and oscillations. The system also provides the required impedance matching for the input and output RF signals of the amplifier. Input and output impedance matching circuits typically include capacitors, resistors, and inductors in associated transmission lines or micro strips for the RF signals into and out of the amplifier chip.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

In order that the manner in which the above recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

The accompanying drawings, which are incorporated in and form a part of this specification, illustrate embodiments of the invention and, together with the description, serve to explain the principles of the invention:

FIG. 3 shows exemplary diagrams of the bottom-side footprint of the power amplifier module and the printed-circuit-board layout of a wireless communication device.

FIG. 7A shows a cross-sectional view of one embodiment of an integrated thermally distributed power amplifier module, while

FIG. 8 shows a simplified schematic of an integrated module with four PAs.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components.

Figure 1:
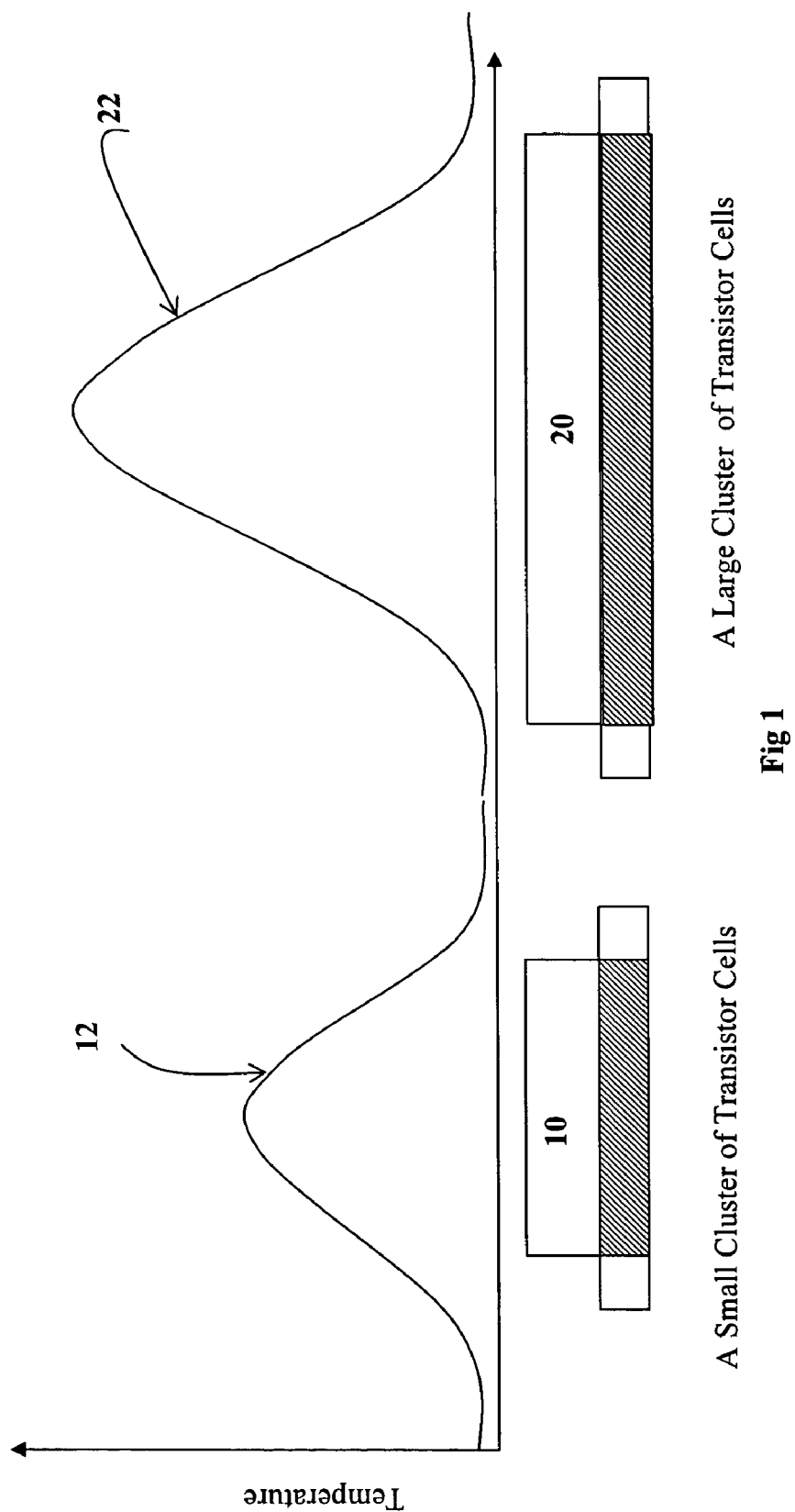
FIG. 1 shows a thermal distribution of a small transistor cell cluster and a large transistor cell cluster.

FIG. 1 shows a thermal distribution of a small transistor cell cluster and a large transistor cell cluster. The PA 10 consists of a small cluster of transistor cells with a temperature or thermal distribution 12. When a more powerful PA is needed, a large cluster of transistor cells 20 are used together to boost the output power. However, when a large cluster of transistor cells are used, the efficiency of DC-to-RF power conversion degrades. As power conversion efficiency degrades, the junction temperature of the transistor cells increases. Furthermore, when a large cluster of transistor cells are placed close together, the temperature profiles aggregate and the combined temperature profile for the cluster further increasing the maximum transistor junction temperature. Increased transistor junction temperature reduces the performance and reliability of the power amplifier. The thermal distribution 22 of multiple combined single PA's, arranged on a semiconductor substrate in a row or a column, shows an increase in the junction temperature, which can cause a high peak temperature for the transistors located in the middle of a power amplifier transistor array.

Figure 2:
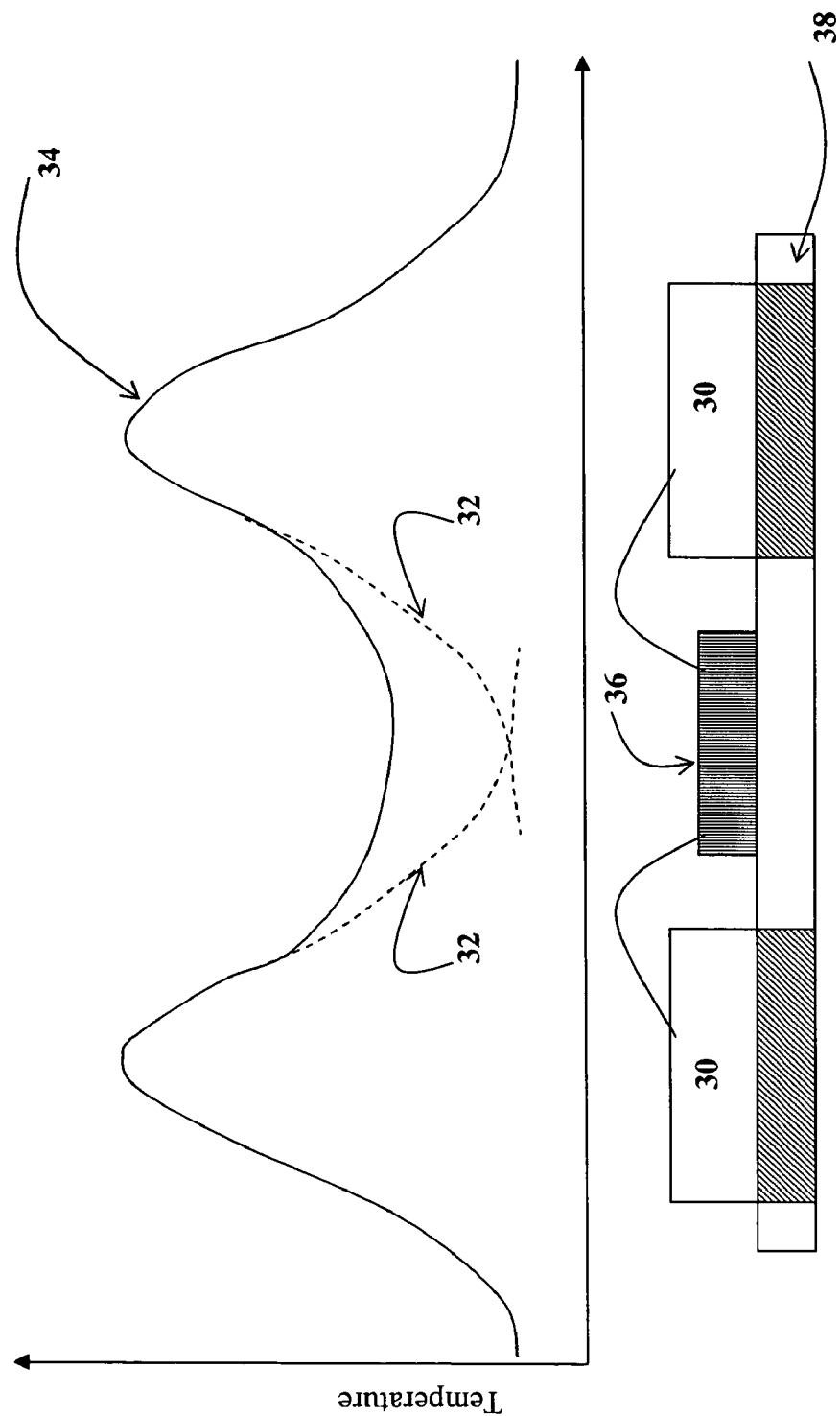
FIG. 2 is one exemplary embodiment of a thermally distributed integrated circuit such as a power amplifier.

FIG. 2 shows a thermal distribution of multi-cluster of transistor cells of one embodiment. In this embodiment, multiple clusters of transistor cells 30 are positioned above a substrate 38. A combiner 36 receives the combined outputs of the PA clusters 30 suitable for presenting the combined outputs to an antenna for transmission. Each cluster 30 has a thermal distribution 32. The resulting profile of the combined clusters 30 is exemplified by a combined temperature profile 34. As shown in FIG. 2, the temperature profile 34 has a maximum at the peak of each individual PA thermal distribution 32. This arrangement avoids the degradation of DC-RF conversion and high temperature caused by the heat generation of a large cluster of transistor cells.

In one embodiment, the thermal distribution is achieved by having the power amplifier transistor cells partitioned into multiple clusters that are physically spaced apart. The transistor cells in each cluster generate a cluster temperature profile and because the clusters are physically spaced apart, the peak temperature generated by such physically distributed clusters is less than the peak temperature if all transistor cells were aggregated in one cluster. Such a thermally distributed system reduces the peak temperature generated when compared against conventional designs where all transistor cells are placed adjacent to each other. This is illustrated in an elevated temperature thermal distribution 22 (FIG. 1) for conventional design in contrast to a reduced temperature thermal distribution 34 (FIG. 2) in a thermally distributed system where the transistor cells are separated into multiple clusters that are spaced apart from each other.

The PA module is built on the substrate 38, which can be a multiplayer printed circuit board (PCB), lead frame, lower-temperature co-fired ceramics (LTCC), or other suitable electronic materials. The substrate includes metal Pins adapted to receive connecting terminals of integrated circuits including the PAs, Bias Circuit, Power Sensor, and optional Control Logic, all of which can be fabricated in an integrated circuit on a semiconductor chip. The Power Amplifiers can be of one or multiple stages. The amplifier IC chip has an electrically conductive metal layer to be bonded to the top metal layer of the module.

The PA module can also include, in accordance with another feature of the present invention, input impedance matching circuit and output impedance matching circuit. The input and output impedance matching networks are preferably based on the 50-ohm standard of the RF industry. Details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

The Bias Circuit is used to bias individual stage with suitable current so the amplifiers can operate with minimal signal distortion. The Bias Circuit receives input from the power control signal and can be selected to operate at different settings of idle current using a mode port. In accordance with the present invention, the mode control signal and the power-control signal may be dependent at least partially on the power-sensing signal output from the Power Sensor circuit.

The PA module is integrated with a Power Sensor circuit that senses the level of the output power. Details of the power sensor circuit are disclosed in the above referenced and commonly assigned U.S. patent application "Accurate Power Sensing Circuit for Power Amplifiers" by Ichitsubo et al., the disclosures of which related application are incorporated herein by reference.

A power amplifier with good linearity generally must maintain a constant amplification factor, known as "Gain", which is defined as the ratio of the output signal power level to the input signal power level. However, at high output power level, the power amplifier can be driven close to saturation and a constant gain becomes difficult to maintain. As a result, the quality of digital communication, commonly measured by Error Vector Magnitude (EVM), Bit Error Rate (BER), Packet Error Rate (PER), Adjacent Channel Power Ratio (ACPR) or other standards, degrades at high output power level.

The Power Sensor receives the amplified radio frequency signal from Power Amplifiers and outputs a power-sensing control signal. The Control Logic receives and processes the power-sensing control signal, and outputs a processed power-sensing control signal to control Power Amplifiers. The processed power-sensing control signal is a function of a quality or a magnitude of the amplified radio frequency signal. For example, the Control Logic improves the linearity performance of power amplifier using the Power Sensor feedback internally. By adjusting the bias of the amplifier depending on the actual output power measured by the Power Sensor, it reduces the tendency of saturation and maintains a more constant gain. Thus the linearity of the amplification over a wide range of power is improved. Yet another method of improving the quality of digital communication is to use an external controller to adjust the input RF signal based the known relationship of digital communication quality to output power level.

The PA module shown in FIG. 2 can be used in a wide range wireless communication devices such as cellular phone, mobile computers, and handheld wireless digital devices. The PA module has a miniature size of a few millimeters.

FIG. 3 is a diagram of the pin-out and the footprint of the PA module in accordance with the present invention. The pin-out 100 shows the bottom side of the PA module that includes a multitude of metal electrodes and an insulating substrate. The physical metal pads 101, 103, 106, 108 in FIG.

3 correspond to grounding Pins 1, 3, 6, 8 in one exemplary integrated circuit pin-out. A center ground 110 serves as major path for dissipating heat generated by the amplifiers. To keep the power amplifier run without excessive temperature, it is important to minimize the heat transfer resistance of the power amplifier to external space on printed circuit. In one embodiment, the device has minimal electrical resistance for the current flowing between the center ground 110 to the ground of the circuit board of the wireless device.

In the typical application for a wireless communication device, the PA module is electrically mounted to a printed circuit board 400 in the wireless communication device. The circuit board includes a grounding circuit design at the location where the PA module is mounted. The grounding circuit design consists of a metal land 410 and four connecting metal lands 401,403,406, and 408 adjacent to the four corners of 410. When the PA module is mounted to the printed circuit board 400, pins 110, 101, 103, 106 and 108 on the bottom surface of the PA module are mated and connected to 410, 401, 403, 406 and 408, respectively.

The metal circuit 410, 401, 403, 406 and 408 are further connected to a ground plane layer of the circuit board, typically below the RF signal layer, by "via holes" 420. The metal structure together with the via holes illustrated in FIG. 4 enables effective current flowing from the bottom conductive layer of the amplifier IC chip to the central metal land 410, out to the metal land 401,403,406,408, and continuing down to the ground plane layer by the "via holes" 420.

The grounding structure also provides efficient heat dissipation from the amplifier IC chip in a similar fashion. The design described above is used advantageously to enhance heat transfer capability so the heat can be dissipated horizontally from the center as well as vertically by metal circuit 410, 401, 403, 406, 408 and via holes 420. Both the horizontal and the vertical means of metal circuits together provide a good 3-dimensional topology for heat dissipation path.

Figure 4:
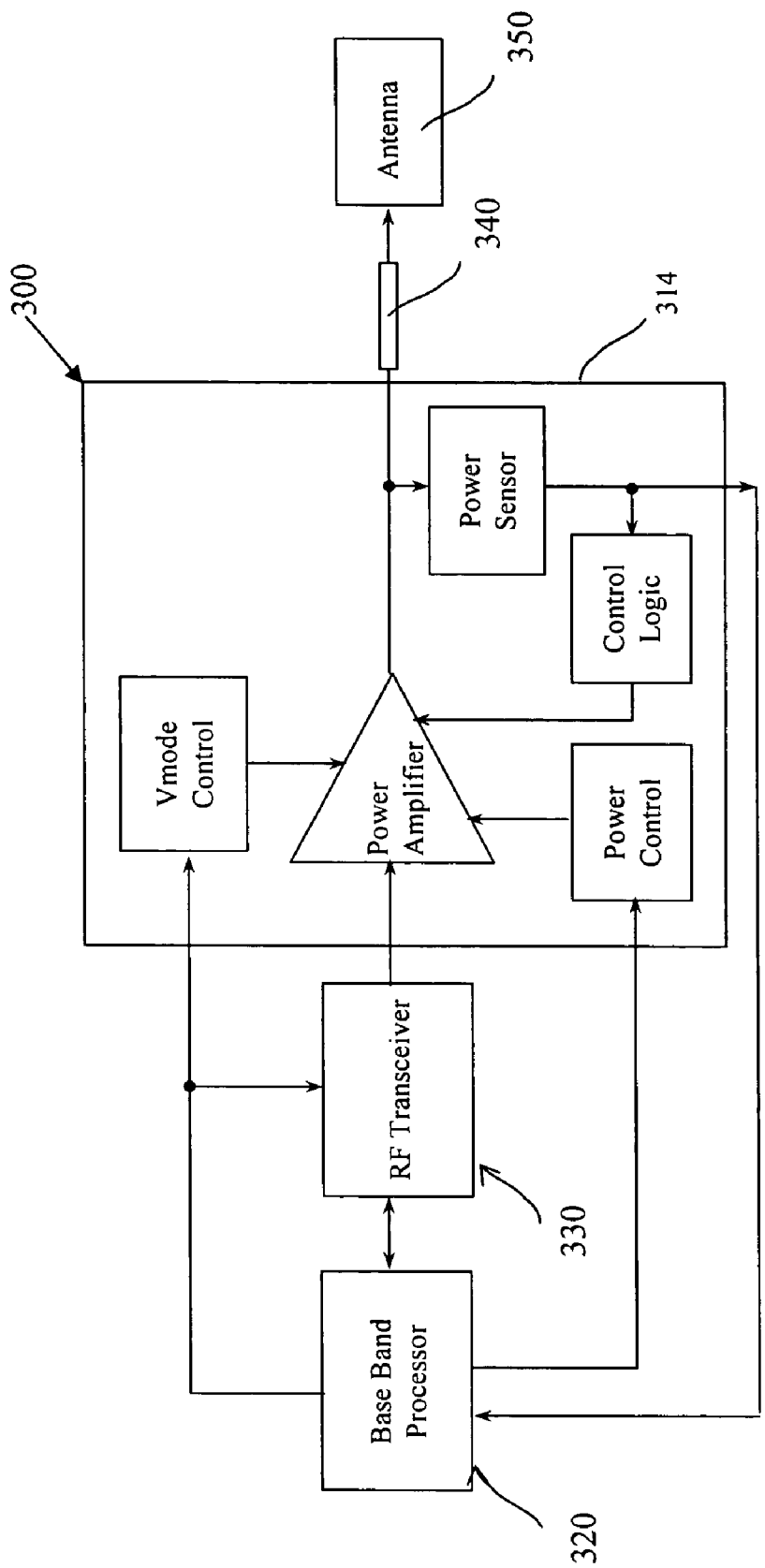
FIG. 4 illustrates the use of the power amplifier module for wireless communications in accordance with an embodiment of the present invention.

FIG. 4 illustrates an exemplary use of the radio frequency PA module for digital wireless communications in accordance to the present invention. The wireless communication device 300 can be a PDA, a WLAN adaptor, or a cellular phone. The wireless communication device 300 includes a base band processor core 320, RF transceivers 330, a thermally distributed PA module 314, and a 50-ohm impedance transmission line or micro strip 340 connected to antenna 350.

A base band chip generates digitally modulated signals. The frequency is up-converted by a RF transceiver to a RF frequency band suitable for transmitting. The RF signal is amplified by the thermally distributed PA module 314 for transmitting by the antenna. The PA module can be turned ON/OFF by the power control signal. The Vmode control signal is used to control and internal settings of the bias circuits by the baseband processor 320 which has the knowledge of the digital signal modulation type and the linear output requirement. For example, when the device is transmitting high power, the Vmode control pin set the power amplifier operating in high current to minimize output distortion. When the device needs to transmit low power, the Vmode control signal sets the power amplifier with low current to conserve battery life.

The Power Sensor measures the output RF power, which can be advantageously used by the baseband processor 320 to set the transmitting power level for the wireless device by varying the RF input signal to the PA module 314.

Figure 5B:
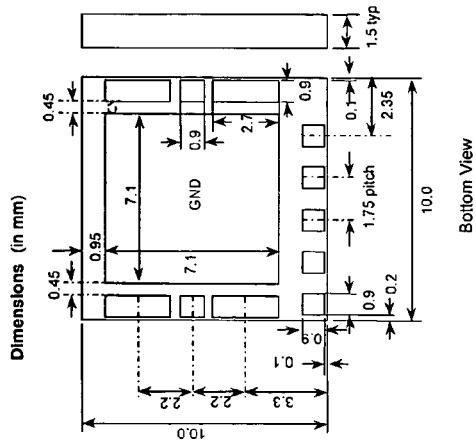
FIG. 5B shows exemplary bottom view dimensions for the embodiment of FIG. 5A.
Figure 5A:
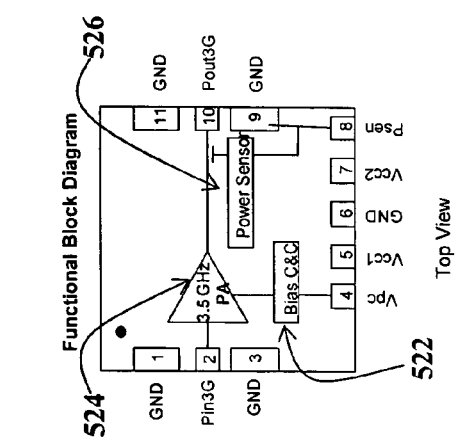
FIG. 5A is an exemplary functional diagram of a high power amplifier embodiment.
Figure 5C:
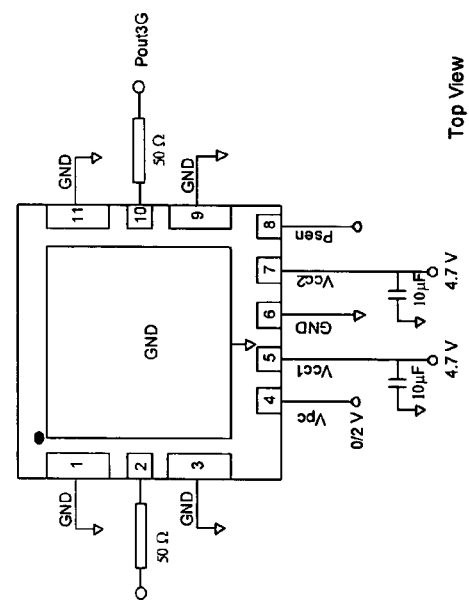
FIG. 5C shows an exemplary typical application of a high power amplifier.
Figure 6B:
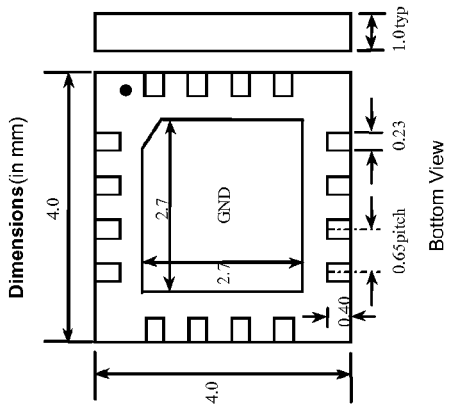
FIG. 6B shows exemplary bottom view dimensions for the embodiment of FIG. 6A.

FIG. 5A is an exemplary functional diagram of a high power amplifier embodiment, while FIG. 5B shows exemplary dimensions for the embodiment of FIG. 5A, while FIG. 5C shows an exemplary typical application of a high power amplifier. Correspondingly, FIG. 6A is an exemplary functional diagram of another high power amplifier embodiment, while FIG. 6B shows exemplary dimensions for the embodiment of FIG. 6A.

In the embodiment of FIG. 5A, a high power amplifier 524 receives RF Pin3G input through pin 2 and provides RF output Pout3G at pin 10. The high power amplifier 524 operates in 3.5 GHz in one embodiment, and can be between 2 GHz to 6 GHz in another embodiment. In yet other embodiments, the high power amplifier 524 can process wireless signals such as OFDM (Orthogonal Frequency Division Multiplexing), VOFDM, COFDM, WiMAX, WiFi, or cellular signals. Pin 1, 3, 9 and 11 are connected to ground. A bias control and compensation circuit 522 receives control voltage Vpc at pin 4 and controls the power amplifier 524. The circuit controls and compensates biasing due to variation in operating environment such as temperature or the load to output. Pin 5 receives a power supply input Vcc1, pin 6 is connected to ground, and pin 7 receives a second power supply input Vcc2. Pin 8 receives the output Psen from a power sensor 526.

One of the multiple Vcc Pins for example could be used to senses high-speed current supplied to the PA through the power supply. In one embodiment, FIG. 5A, Pin 5 could be used to sense power dissipation, which in turn produces heat and affects the sensing resistance.

Figure 6C:
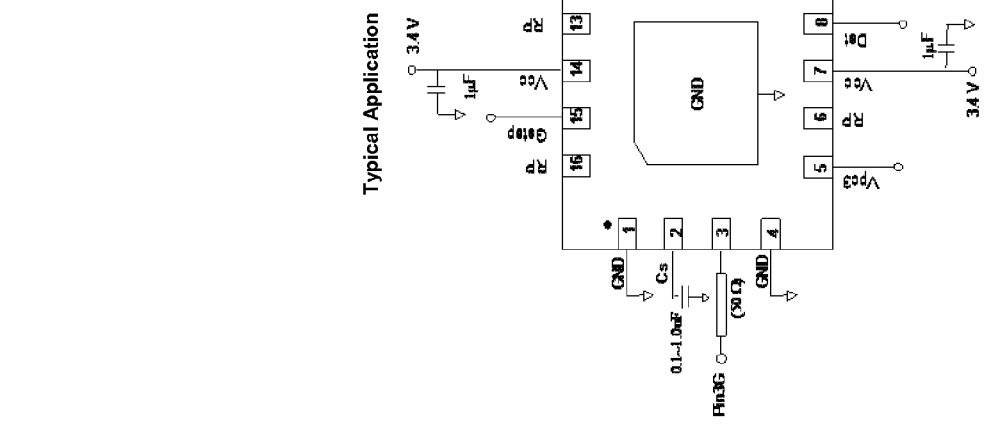
FIG. 6C shows an exemplary typical application of a high power amplifier.
Figure 6A:
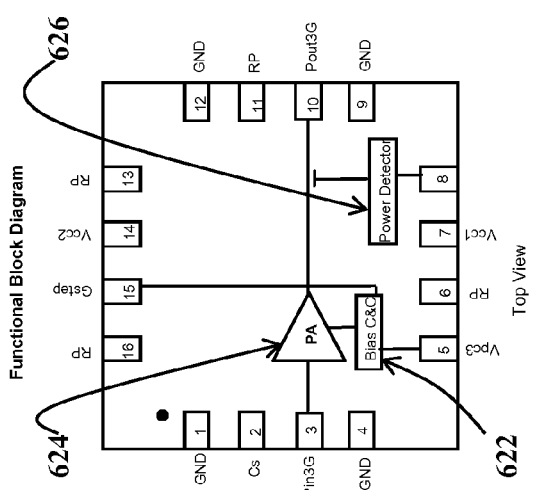
FIG. 6A is an exemplary functional diagram of another high power amplifier embodiment.

In the embodiment of FIG. 6A, a high power amplifier 624 receives RF Pin3G input through pin 3 and provides RF output Pout3G at pin 10. The high power amplifier 624 operates in 3.5 GHz in one embodiment, and can be between 2 GHz to 6 GHz in another embodiment. In yet other embodiments, the high power amplifier 624 can process the CDMA, OFDM, OFDMA, COFDM, WiMAX (802.16), WiFi (802.11), WiBro, or cellular signals. Pin 1, 4, 9 and 12 are connected to ground. A bias control circuit 622 receives control voltage Vpc3 at pin 5 and controls the power amplifier 624. Pin 15 supplies gain control step, externally adjustable if gain step is required for an application. Pin 7 receives a power supply input Vcc1 and pin 14 receives a second power supply input Vcc2. Pin 8 receives the output Psen from a power sensor 626. Pins 6,11,13 and 16 are reserved pins for internal connection or extension of functions in the future. Cs pin 2 is reserved for a bypass capacitor to conduct an alternating current around a component.

The embodiments of FIGS. 5A and 6A differ in the dimensions. The embodiment of FIG. 5B is a square module with dimensions of approximately 10 mm×10 mm and a thickness of about 10.5 mm. In the embodiment of FIG. 5A, when viewed from the bottom, pins 1, 3, 9 and 11 have rectangular pads each with dimensions of about 0.9 mm×2.7 mm. The input and output pins 2 and 10 are square pads with dimensions of about 0.9 mm×0.9 mm and are separated from adjacent ground pins 1 and 3 and ground pins 9 and 11 with center-to-center separations of about 2.2 mm. For example, the center of pin 2 is 2.2 mm from the centers of pin 1 and pin 3, respectively. A ground pad with dimensions of about 7.1 mm×7.1 mm is spaced apart from pins 1, 2, 3, 9, 10, and 11 by about 0.45 mm. On the side that does not have any pads formed thereon, the ground pad is 0.95 mm from that side of the module. Pins 4-8 have square pads each about 0.9 mm×0.9 mm in dimensions and each separated from each other by about 1.75 mm when measured from center to center. Moreover, the center of pin 4 is 2.35 mm from the module edge that pins 1-3 are positioned thereon. Electrical characteristics of the embodiment, for a typically 3.5 GHz PA module, of FIGS. 5A-5B are as follows:

| Signal Description | | |
|---|---|---|
| Pin # | Name | Description |
| 1, 3, 6, 9, 11 | GND | Ground |
| 2 | Pin3G | RF Input |
| 4 | Vpc | Power Control, Enable/Disable |
| 5 | Vcc1 | Power Supply 1 |
| 7 | Vcc2 | Power Supply 2 |
| 8 | Psen | Power Sensor |
| 10 | Pout3G | RF Output |

| Absolute Maximum Ratings | | |
|---|---|---|
| Parameter | Value | Unit |
| Supply Voltage | 6.0 | V |
| Power Control Voltage | 3.5 | V |
| RF Input Power | 25 | dBm |
| Operating Case Temperature | −40 to 85 | ° C. |
| Storage Temperature | −30 to 120 | ° C. |

Caution: ESD sensitive.

| Key Electrical Characteristics | | | | | |
|---|---|---|---|---|---|
| Parameter | Min | Typical | Max | Unit | Condition |
| Operating Power Supply Voltage[1] | | 4.7 | | V | |
| Frequency Range | 3.3 | 3.5 | 3.7 | GHz | |
| Linear Output | | 30 | | dBm | EVM = 25% (OFDM/64QAM) |
| Small Signal Gain L/LS | | 30/15 | | dB | |
| Output Harmonics | | −45 | | dBc | Pout = 30 dBm |
| Output Noise Level | | | −135 | dBm/Hz | |
| Power Control - Enable | | >2.0 | | V | |
| Power Control - Disable | | <0.5 | | V | |
| Power Control Current | | 0.5 | | mA | |
| Quiescent Current | | 380 | | mA | |
| Input VSWR | | <2:1 | | | |
| DC Supply Current | | 1400 | | mA | Vcc = 4.7 V, Pout = 30 dBm |

[1]Operation above these ranges may reduce product reliability.

Electrical characteristics of the embodiment, for a typically 2.5 GHz PA module, of are as follows:

| Key Electrical Characteristics | | | | | |
|---|---|---|---|---|---|
| Parameter | Min | Typical | Max | Unit | Condition |
| Operating Power Supply Voltage[1] | | 4.7 | | V | |
| Frequency Range | 2.3 | 2.5 | 2.7 | GHz | |
| Linear Output | | 30 | | dBm | EVM = 2.5% (OFDM/64QAM) |
| Small Signal Gain | | 31 | | dB | |
| Output Harmonics | | −45 | | dBc | Pout = 30 dBm |
| Output Noise Level | | | −135 | dBm/Hz | |
| Power Control - Enable | | >2.0 | | V | |
| Power Control - Disable | | <0.5 | | V | |
| Power Control Current | | 0.5 | | mA | |
| Quiescent Current | | 550 | | mA | |
| Input VSWR | | <2:1 | | | |
| DC Supply Current | | 1550 | | mA | Vcc = 4.7 V, Pout = 30 dBm |

[1]Operation above these ranges may reduce product reliability.

Turning now to the embodiment of FIG. 6B, the module is a rectangle with dimensions of approximately 4 mm×4 mm and a thickness of about 1 mm. When viewed from the bottom, all pins have rectangular pads each with dimensions of about 0.4 mm×0.23 mm. The pins are separated from adjacent pins with center-to-center separations of about 0.6 mm. For example, the center of pin 2 is 0.65 mm from the centers of pin 1 and pin 3, respectively.

In FIG. 6B, a ground pad with dimensions of about 2.7 mm×2.7 mm is centrally positioned between all the pins. Electrical characteristics of the embodiment, for a typical 3.5 GHz PA module, of FIGS. 6A-6B are as follows:

Signal Description

| Pin # | Name | Description |
|---|---|---|
| 1, 4 | GND | Ground |
| 2 | Cs | Bypass Capacitor |
| 6, 11, 13, 16 | RP | Reserved Pin (Do Not Connect) |
| 3 | Pin3G | RF Input |
| 5 | Vpc3 | PA Power Control, On/Off |
| 7, 14 | Vcc1, Vcc2 | Power Supply |
| 8 | Det | Power Detector |
| 9, 12 | GND | Ground |
| 10 | Pout3G | RF Output |
| 15 | Gstep | Gain Step |

Absolute Maximum Ratings

| Parameter | Value | Unit |
|---|---|---|
| Supply Voltage | 5.0 | V |
| Power Control Voltage | 3.5 | V |
| RF Input Power | 10 | dBm |
| Operating Case Temperature | −5 to 85 | ° C. |
| Storage Temperature | −30 to 120 | ° C. |

Caution: ESD sensitive.

Electrical Characteristics

| Parameter | Min | Typical | Max | Unit | Condition |
|---|---|---|---|---|---|
| Operating Power Supply Voltage[1] | 3 | 3.4 | 3.6 | V | |
| Frequency Range (WiMax) | 3.3 | | 3.7 | GHz | |
| Linear Output | | 25 | | dBm | @ 2.75% EVM (OFDM/64QAM) |
| Small-signal Gain | | 31 | | dB | Gstep = Lo |
| Gain Step | | −25 | | dB | Gstep = Hi |
| Output Harmonics | | −50 | | dBc | Pout = 25 dBm |
| Output Noise Level | | | −135 | dBm/Hz | |
| Power Control - Enable | 2.55 | 2.60 | | V | |
| Power Control - Disable | | <0.5 | | V | |
| Power Control Current | | 5 | | mA | |
| Quiescent Current | | 200 | | mA | |
| Input VSWR | | | <2:1 | | |
| DC Supply Current[1] | | 560 | | mA | Vcc = 3.4 V, Pout = 25 dBm |

[1]Operation above these ranges may reduce product reliability.

In the embodiment of integrated PA module shown in FIG. 6C, two clusters of transistor cells are electrically connected together at pin #10 (Pout3G) as the RF Output port. At the RF output port is an impedance transformer which includes a transmission line and a capacitor coupled to the transmission line and the ground. The impedance transformer matches the output impedance of the PA module to 50-ohm load.

Figure 7A:
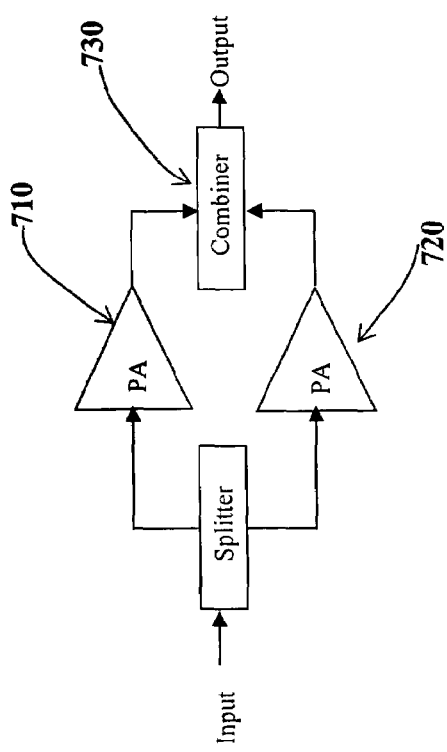
Figure 7B:
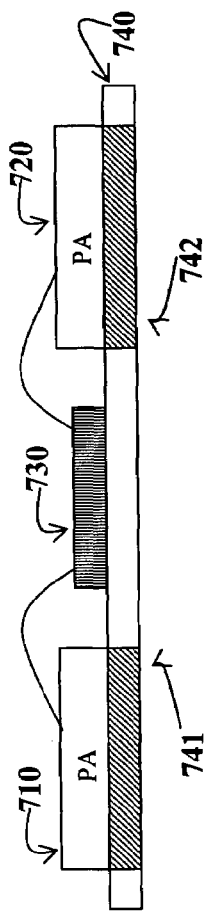
FIG. 7B shows a simplified schematic of an integrated module with two PAs.
Figure 9:
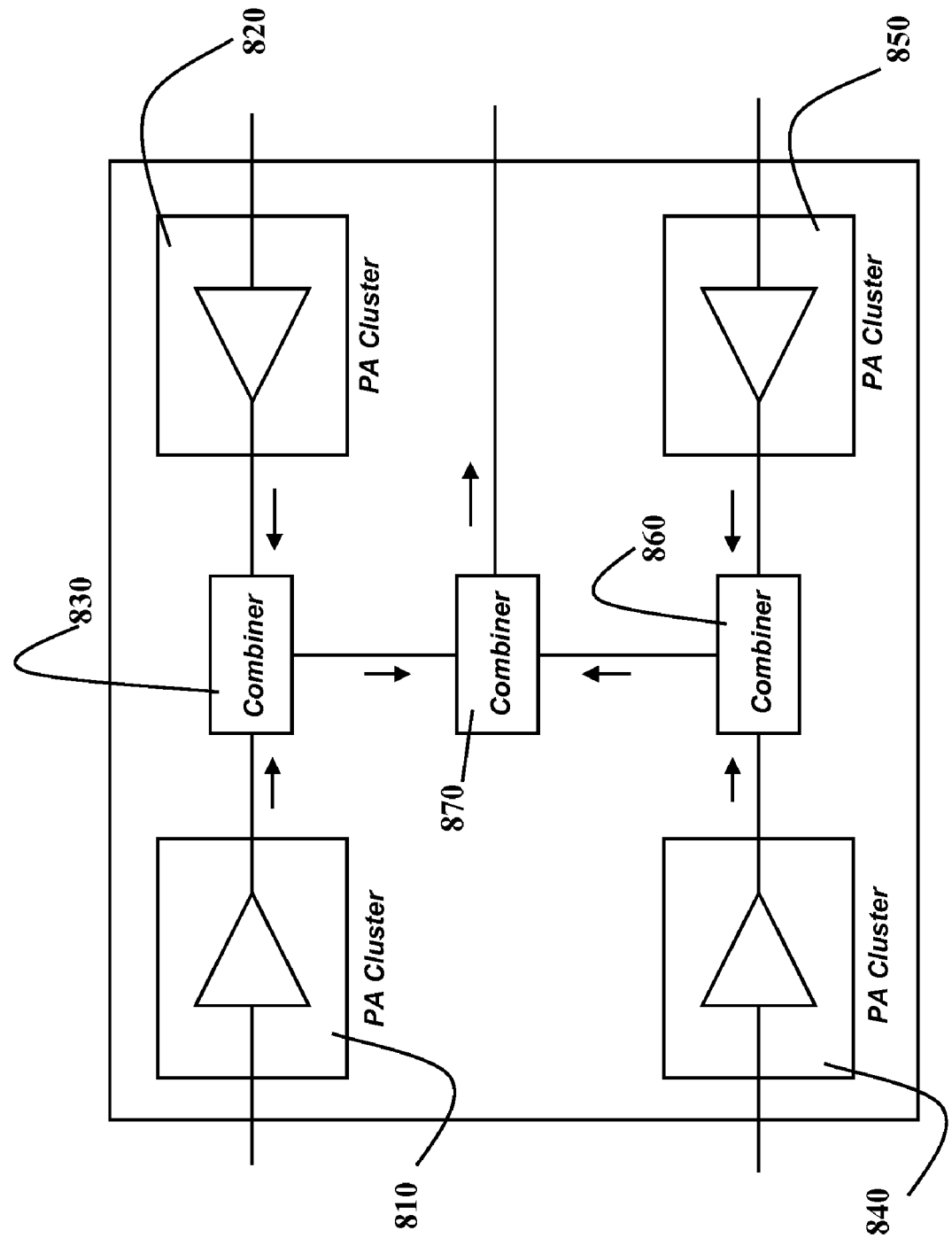
FIG. 9 shows a simplified layout of the integrated module of FIG. 8 with four PA clusters.

FIG. 7A shows a cross-sectional view of one embodiment of a thermally distributed power amplifier module while FIG. 7B shows a simplified top-level view of the embodiment of FIG. 7A. As shown therein, a radio frequency (RF) power amplifier 710 is positioned above a substrate 740. The substrate 740 has a plurality of heating conducting regions, 741 and 742, where the heat generated by the two clusters of transistors are dissipated through. The first cluster of transistors 710 is thermally connected to the heat conducting region 741. Correspondingly, a second cluster of transistors 720 is positioned above the substrate 740 and is thermally connected to a second heat conducting region 742. A combiner 730 receives the output of the first and second power amplifiers 710 and 720 and provides the output as the module's amplified RF output.

The circuit of FIGS. 7A-7B provides increased amplification of RF signals by joining the outputs of a plurality of power amplifiers 710 and 720. Using a single amplifier 710 or 720 may not be suitable due to space/weight constraints on a circuit board or due to power limitations of the amplifier 710 or 720. Accordingly, module divides the signal into a plurality of identical signals and provides them to a like plurality of amplifiers 710 and 720. The outputs of these amplifiers 710 and 720 are then combined with the combiner 730 to achieve the desired power rating which is greater than a single amplifier.

The RF combiner 730 is a passive RF device used to add together two or more of these RF signals. Various suitable combiners such as the Branchline, Gysel or Wilkinson combiner or the serial stripline coupler can be used. The stripline combiner is smaller than the Wilkinson combiner and utilizes a plurality of layers of dielectric with interposed striplines and ground planes. Other suitable combiners can also be used.

FIG. 8 shows a cross-sectional view of a second embodiment of a thermally distributed power amplifier module. In this embodiment, in addition to the first and second power amplifiers 810 and 820 and the combiner 830, third and fourth power amplifiers 840 and 850 are provided. A combiner 860 aggregates the outputs of the amplifiers 840 and 850. A third combiner 870 then combines the outputs of the combiners 830 and 860. The result is a quad power amplifier system that distributes temperature in the four corners of the module and provides a single aggregated output that is higher than any of the individual power amplifiers 810, 820, 830 and 840.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components.

The PA module shown above can be used in a wide range wireless communication devices such as cellular phone, mobile computers, handheld wireless digital devices, consumer premise equipment, and set-top boxes. The PA module has a miniature size of a few millimeters.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. An integrated power amplifier (PA) module formed on a substrate, comprising:
   a first cluster of transistor cells and a first electrical circuit positioned in a first portion of the substrate;
   a second cluster of transistor cells and a second electrical circuit positioned in a second portion of the substrate and spaced apart from the first portion; and
   a combiner coupled to the first and second clusters to combine the output of the first and second clusters, wherein each cluster comprises one or more of: impedance matching circuit, biasing control and compensation circuit, power amplifier driver, and power sensing circuit.

2. The module of claim 1, comprising
   a third cluster of transistor cells positioned in a third portion of the substrate spaced apart from the first and second clusters;
   a fourth cluster of transistor cells positioned in a fourth portion of the substrate spaced apart from the first, second and third clusters;
   a second combiner coupled to the third and fourth clusters; and
   a third combiner coupled to the first and second combiners to combine the output of the first, second, third and fourth clusters.

3. The module of claim 1, wherein the combiner comprises an impedance transformer including a transmission line and a capacitor coupled to the transmission line and ground.

4. The module of claim 1, comprising a molding compound formed to enclose the first and second clusters of transistor cells, and the substrate.

5. The module of claim 1, wherein one of Vcc pins senses a current consumption of the PA module.

6. The module of claim 1, wherein the substrate comprises one of: a metal lead-frame, a semi insulating compound semiconductor substrate, a micro-strip on printed circuit board, a copper-clad epoxy fiberglass, a Low Temperature Co-fired Ceramic (LTCC) substrate, a gallium arsenide substrate, a silicon substrate.

7. The module of claim 1, comprising a substrate having first, second and third sides with pads positioned thereon and a fourth side without a pad, the substrate having an input pad on a first side coupled to an input RF signal and positioned between two ground pads, the substrate further having an output pad on a third side coupled to an amplified output RF signal and positioned between two other ground pads.

8. The module of claim 7, wherein the substrate comprises dimensions of approximately 10 mm×10 mm and a thickness of about 1.5 mm.

9. The module of claim 7, wherein each ground pad comprises a rectangular pad with dimensions of about 0.9 mm×2.7 mm.

10. The module of claim 7, wherein the input and output pads comprise square pads with dimensions of about 0.9 mm×0.9 mm and separated from adjacent ground pads with center-to-center separations of about 2.2 mm.

11. The module of claim 7, comprising a ground plane with dimensions of about 7.1 mm×7.1 mm positioned spaced apart from the ground pads and the input and the output pads by about 0.45 mm.

12. The module of claim 11, wherein the ground plane is about 0.95 mm from the fourth side.

13. The module of claim 7, wherein the second side comprises five square pads each about 0.9 mm×0.9 mm in dimensions and each separated from each other by about 1.75 mm when measured from center to center.

14. The module of claim 7, wherein the center of a pad corresponding to pin 4 is about 2.35 mm from the first side.

15. The module of claim 7, wherein the substrate comprises dimensions of approximately 10 mm×10 mm and a thickness of about 1.5 mm, each ground pad comprises a rectangular pad with dimensions of about 0.9 mm×2.7 mm, the input and output pads comprise square pads with dimensions of about 0.9 mm×0.9 mm and separated from adjacent ground pads with center-to-center separations of about 2.2 mm, further comprising a ground plane with dimensions of about 7.1 mm×7.1 mm positioned spaced apart from the ground pads and the input and the output pads by about 0.45 mm and wherein the ground plane is about 0.95 mm from the fourth side, and wherein the second side comprises five square pads each about 0.9 mm×0.9 mm in dimensions and each separated from each other by about 1.75 mm when measured from center to center the center of a pad corresponding to pin 4 is about 2.35 mm from the first side.

16. The module of claim 7, wherein the substrate comprises dimensions of approximately 4 mm×4 mm and a thickness of about 1 mm.

17. The module of claim 7, wherein each ground pad comprises a rectangular pad with dimensions of about 0.40 mm×0.23 mm.

18. The module of claim 7, wherein the input and output pads comprise square pads with dimensions of about 0.4 mm×0.4 mm and separated from adjacent ground pads with center-to-center separations of about 0.65 mm.

19. The module of claim 7, comprising a ground plane with dimensions of about 2.7 mm×2.7 mm and wherein the ground plane is about 0.25 mm from the fourth side.

20. A method for providing radio frequency power amplification, comprising:

positioning a first power amplifier in a first portion of the substrate;

positioning a second power amplifier positioned in a second portion of the substrate spaced apart from the first portion; and combining the outputs of the first and second power amplifiers, wherein each rower amplifier comprises one or more of: impedance matching circuit, biasing control and compensation circuit, power amplifier driver, and rower sensing circuit.

* * * * *